United States Patent
Cho et al.

(10) Patent No.: US 6,651,735 B2
(45) Date of Patent: Nov. 25, 2003

(54) EVAPORATOR OF CPL COOLING APPARATUS HAVING FINE WICK STRUCTURE

(75) Inventors: Hye-jung Cho, Kyungki-do (KR); Yong-Soo Lee, Seoul (KR); Seog-woo Hong, Busan (KR); In-seob Song, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/144,722

(22) Filed: May 15, 2002

(65) Prior Publication Data

US 2002/0170705 A1 Nov. 21, 2002

(30) Foreign Application Priority Data

May 15, 2001 (KR) .......................................... 2001-26417
Apr. 23, 2002 (KR) .......................................... 2002-22217

(51) Int. Cl.[7] .............................................. F28D 15/00
(52) U.S. Cl. ........................ 165/104.26; 165/104.33; 361/700; 257/715; 174/15.2
(58) Field of Search ........................ 165/104.26, 104.21, 165/104.33, 80.4; 361/699, 700; 257/715, 716; 174/15.2

(56) References Cited

U.S. PATENT DOCUMENTS

| | | | | | |
|---|---|---|---|---|---|
| 4,467,861 A | * | 8/1984 | Kiseev et al. | .......... | 165/104.22 |
| 4,903,761 A | * | 2/1990 | Cima | ..................... | 165/104.26 |
| 5,725,049 A | * | 3/1998 | Swanson et al. | ........ | 165/104.26 |
| 6,241,008 B1 | * | 6/2001 | Dunbar | .................. | 165/104.26 |
| 6,330,907 B1 | * | 12/2001 | Ogushi et al. | ......... | 165/104.26 |
| 6,533,029 B1 | * | 3/2003 | Phillips | .................. | 165/104.26 |

* cited by examiner

Primary Examiner—Terrell Mckinnon
(74) Attorney, Agent, or Firm—Burns, Doane, Swecker & Mathis, L.L.P.

(57) ABSTRACT

An evaporator of a capillary pumped loop (CPL) cooling apparatus having a fine wick structure is provided. The evaporator having a flat board shape, of a capillary pumped loop (CPL) cooling apparatus includes a coolant storing part for storing in-flowing coolant from the condenser and collecting a uncondensed gas contained in the in-flowing coolant in an upper space, a cooling part for cooling the heating body through vaporization of the coolant, and superstructure and substructure combined with each other, for defining a channel region in which the coolant flows from the coolant storing part to the cooling part by a capillary action. In this case, the substructure includes a first substructure used as a substrate and a second substructure formed along a border of the substrate, or includes first through third segments equal to the first and second substructures. The channel region is formed between the second segment and the superstructure, and a pumping means formed of patterns that are formed so that the capillary action is generated in the coolant, or a porous material is included in the channel region.

49 Claims, 14 Drawing Sheets

EVAPORATOR OF CPL COOLING APPARATUS HAVING FINE WICK STRUCTURE

Priority is claimed to Patent Application Numbers 2001-26417 filed in Rep. of Korea on May 15, 2001 and 2002-2217 filed in Rep. of Korea on Apr. 23, 2002, both herein incorporated by reference.

BACKGROUND OF THE INVENTION

1. Field of the Invention

The present invention relates to an evaporator of a cooling apparatus, and more particularly, to an evaporator of a capillary pumped loop (CPL) cooling apparatus having a fine wick structure.

2. Description of the Related Art

Although power required to drive a semiconductor device comprising chips is very small, if the number of chips in the semiconductor device, that is, if the integration of chips, is high, heating values for areas increase, and the surface temperatures of chips accordingly increase.

If the surface temperature of chips increases, their reliability and life span are reduced.

Accordingly, various methods for cooling chips have been suggested. One of the methods uses a capillary pumped loop (CPL) in which the surface tension of coolant in a fine structure is used as part of a driving force for circulating coolant.

The CPL is comprised of an evaporator for contacting a heating body and absorbing heat from the heating body, a condenser for condensing vapor, and a liquid tube and a vapor tube connected between the evaporator and the condenser.

The temperature and pressure of the vapor generated in the evaporator are higher than the vapor of the condenser. Thus, the vapor generated in the evaporator naturally flows into the condenser. In the condenser, the vapor is condensed to become liquid. The liquid flows into the evaporator by a capillary action generated in the liquid pipe and the evaporator having a fine wick structure and is used as coolant cooling the heating body.

The cooling performance of the CPL depends on the structure and connection of elements. In particular, the structure of the evaporator for absorbing heat from the heating body and pumping liquid condensed by the condenser plays a more important role in the cooling performance of the CPL.

The design of a flowing-out structure for transporting vapor generated by absorbing heat from the heating body, from the evaporator into the condenser, and a fine structure for flowing liquid condensed by the condenser into the evaporator without a dry-out phenomenon (a phenomenon that the flow of liquid is cut off on the surface of the evaporator, and thus the surface of the evaporator dries out) are the most important considerations when designing an evaporator.

In a case where the flowing-out of vapor generated in the evaporator and flowing-in of liquid from the condenser into the evaporator are performed in balance, an evaporator of a CPL cooling apparatus capable of stable and high performance can be realized. However, a conventional evaporator of a CPL cooling apparatus does not meet this requirement.

SUMMARY OF THE INVENTION

To solve the above problem, it is an object of the present invention to provide an evaporator of a capillary pumped loop (CPL) cooling apparatus which is capable of balancing the flowing-out of evaporated vapor with the supply of coolant, performing stably and improving cooling efficiency.

Accordingly, to achieve the above object, according to one aspect of the present invention, there is provided an evaporator of a capillary pumped loop (CPL) cooling apparatus comprising a condenser, an evaporator for being supplied coolant from the condenser and cooling a heating body according to variation in a phase of the coolant. The evaporator having a flat board shape, of a CPL cooling apparatus includes a coolant storing part for storing in-flowing coolant from the condenser and collecting a uncondensed gas contained in the in-flowing coolant in an upper space, a cooling part for cooling the heating body through vaporization of the coolant, and superstructure and substructure combined with each other, for defining a channel region in which the coolant flows from the coolant storing part to the cooling part by a capillary action.

The substructure includes a first substructure used as a substrate, and a second substructure forming a coolant inlet formed along a border of the first substructure and connected to a coolant outlet of the condenser between the substructure and the superstructure, and a vapor outlet connected to a vapor inlet of the condenser.

The channel region is formed between the coolant storing part and the cooling part, and part of the channel region is extended between the cooling part and the second substructure.

It is also preferable that the bottoms of the coolant storing part, the channel region, and the cooling part are comprised of at least one pattern region.

It is also preferable that the cooling part includes two pattern regions. That is, predetermined patterns (hereinafter, is referred to as heated portion pattern region) are included in a region corresponding to a heated portion. Further, one other pattern region for completely surrounding the heated portion pattern region is included between the channel region and the heated portion pattern region. Further, one other pattern region includes a region in which at least two different patterns are formed.

It is also preferable that a plurality of patterns are formed in at least one region of the coolant storing part, the channel region, or the bottom of the cooling part such that the coolant flowing from the condenser or other adjacent pattern regions flows into the cooling part or the center of the cooling part isotropically or anisotropically. In this case, each of the plurality of patterns allowing the coolant to flows anisotropically has a predetermined height and a predetermined geometrical shape in which the flat shape of each of the plurality of patterns has a predetermined length in a direction of the flow of the coolant, and the height of the plurality of patterns is higher or lower than the height of patterns formed in the adjacent pattern regions.

A plurality of patterns are distributed in one pattern region of the pattern regions forming the cooling part such that the coolant flowing from the adjacent pattern region flows into the center of the cooling part, and simultaneously isotropically flows into the entire own pattern region.

A plurality of patterns are distributed in the center of the cooling part such that the coolant flowing from the adjacent pattern region uniformly and quickly flows into the entire own pattern region, and simultaneously transfers heat generated from the heating body in a vertical direction. In this case, each of the plurality patterns has a predetermined height and a predetermined geometrical shape, and the thicknesses of the plurality of patterns become smaller and their heights become higher from the center of the cooling part.

In order to achieve the above object, according to another aspect of the present invention, the substructure includes a first segment comprising the coolant storing part together with the superstructure and forming a coolant inlet connected to the coolant outlet of the condenser, second segment being opposite to a side defining the channel region of the superstructure and whose one side adheres closely to the first segment so that the coolant is not leaked, and a third segment comprising the cooling part together with the superstructure, forming a vapor outlet connected to the vapor inlet of the condenser and adhering closely to the other side of the second segment so that the coolant is not leaked.

It is preferable that step exists between the first and second segments and/or between the second and third segments.

It is also preferable that a pumping means for pumping the coolant filling the channel region and flowing into the coolant storing part to the cooling part is included between the second segment and the side defining the channel region of the superstructure. The pumping means is formed of a porous material. The pumping means is formed of a porous material and patterns formed in part of the second segment, and the patterns are formed so that the capillary action is generated in the coolant flowing into the coolant storing part or the in-flowing coolant through the porous material.

It is also preferable that part of the channel region is extended into the cooling part and a vertical portion of the third segment. Another part of the channel region is extended into the coolant storing part and a vertical portion of the first segment.

According to the present invention, a coolant storing part for separately storing a uncondensed gas and liquid is included in the evaporator of a CPL cooling apparatus, and thus, the coolant can be stably supplied to the cooling part, and the present invention can prevent the uncondensed gas from flowing into the condenser and accumulating on the condenser, thereby uniformly and continuously supplying the coolant removed by evaporation in the cooling part from the coolant storing part to the cooling part and improving cooling efficiency.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
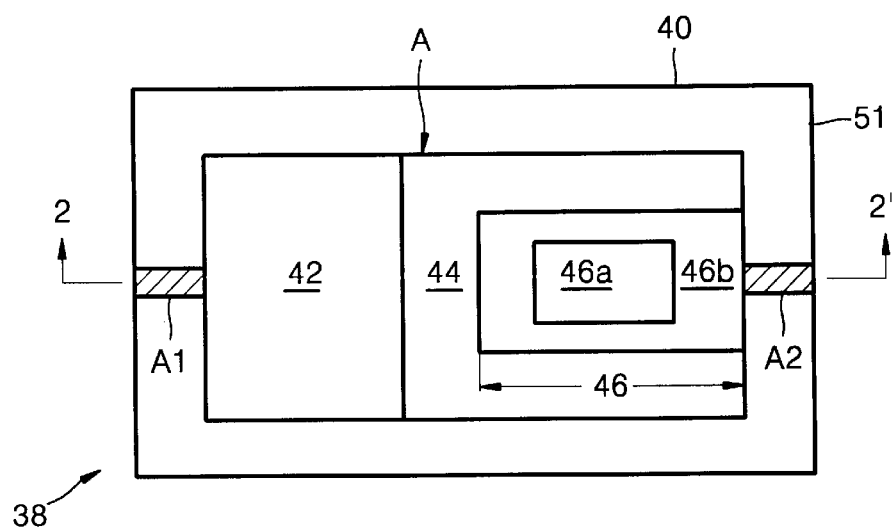
FIG. 1 is a plan view illustrating the structure of the bottom of an evaporator of a capillary pumped loop (CPL) cooling apparatus having a fine wick structure according to an embodiment of the present invention.
Figure 2:
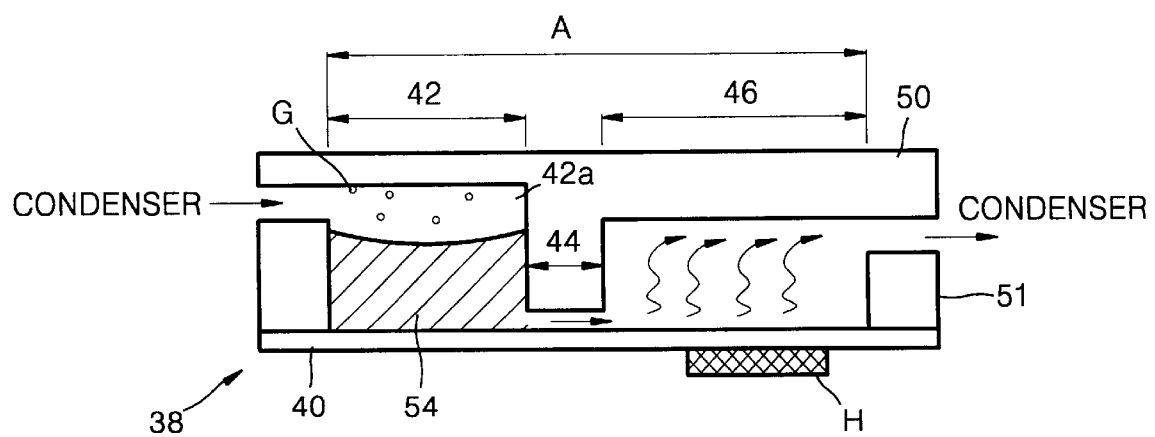
FIG. 2 is a sectional view taken along line 2–2' of FIG. 1 with an upper plate covering the bottom.

Hereinafter, an evaporator of a capillary pumped loop (CPL) cooling apparatus according to embodiments of the present invention will be described in detail with reference to the attached drawings. The thickness of layers or regions shown in the drawings may be exaggerated for clearance of the specification. FIG. 1 is a plan view of a substructure of an evaporator. FIG. 2 is a sectional view taken along line 2–2' of FIG. 1 with a superstructure.

Referring to FIG. 1, reference numeral 38 denotes a substructure of an evaporator. The substructure 38 consists of first and second substructures 40 and 51. The first substructure 40 denotes a substrate on which coolant flows along its surface and a heating body contacts its back side. Hereinafter, the fist substructure 40 is referred to as substrate 40. The second substructure 51 is formed along a border of the substrate 40. An inside region A of the substrate 40 is defined by the second substructure 51. The inside region A of the substrate 40 contacts coolant flowing in from a condenser (not shown) through a coolant inlet A1 that is formed at one side of the second substructure 51. Hereinafter, the inside region A of the substrate 40 is referred to as coolant contact part A. The coolant contact part A includes a coolant storing part 42, a channel region 44, and a cooling part 46. A pattern is formed to have a predetermined shape for flowing coolant on the bottom of each part and region. The coolant storing part 42 is a region in which coolant flowing in from a condenser through a coolant inlet A1 is stored. The channel region 44 is a region through which the coolant flows from the coolant storing part 42 to the cooling part 46 by the capillary action. The cooling part 46 is a region in which the coolant supplied from the channel region 44 absorbs the heat of a heating body H and undergoes vaporization, and is a substantial cooling region of the heating body H.

Considering that the coolant is vaporized (evaporated) in the cooling part 46 by heat generated by the heating body H, the cooling part 46 may also be an evaporating part.

The phase-varied (vaporized) coolant is exhausted into the condenser (not shown) through a vapor outlet A2. The coolant inlet A1 and the vapor outlet A2 are configured in series along the path of coolant flow, thereby preventing backward flow between the vapor generated in the cooling part 46 and the condensed coolant, and further preventing heat transfer between the high temperature vapor outlet A2 and the coolant inlet A1.

The coolant storing part 42, the channel region 44, and the cooling part 46 are consecutively formed in a line. Since the coolant contact part A is a region which is defined on one substrate 40, the coolant storing part 42, the channel region 44, and the cooling part 46 may be one unit.

The coolant storing part 42, the cooling part 46, and the channel region 44 are classified by the role of each part or region, but are integrated into one unit through the substrate 40 such that the coolant consecutively flows from the coolant storing part 42 to the cooling part 46 through the channel region 44, as shown in FIG. 2.

Figure 3:
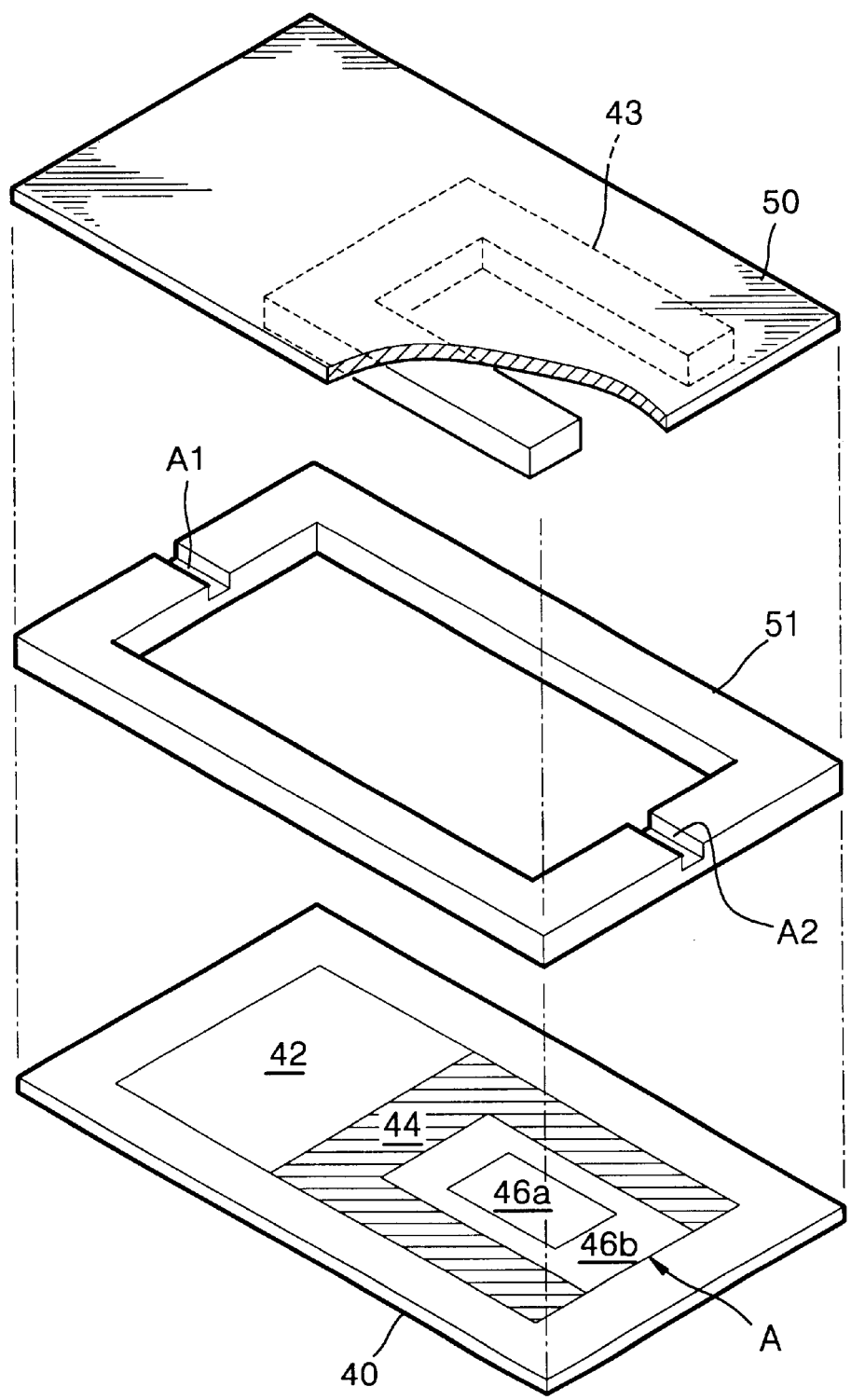
FIG. 3 is an exploded view of the structure shown in FIG. 1.

It can be seen in FIGS. 2 and 3 that three-dimensional regions such as the coolant storing part 42, the channel region 44, and the cooling part 46, are defined by a superstructure 50 and the substructure 38. It can also be seen in FIGS. 2 and 3 that the evaporator including the superstructure 50 and the substructure 38 has a flat board shape.

Figure 4:
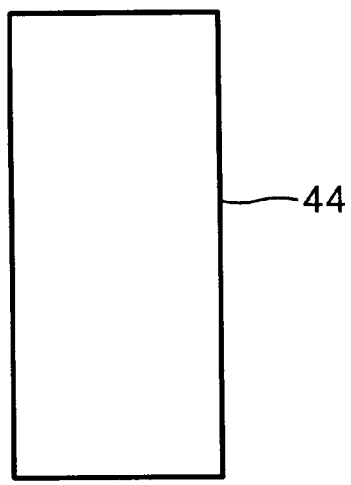
FIG. 4 is a plan view of a modified channel region of the evaporator of FIG. 1.
Figure 5:
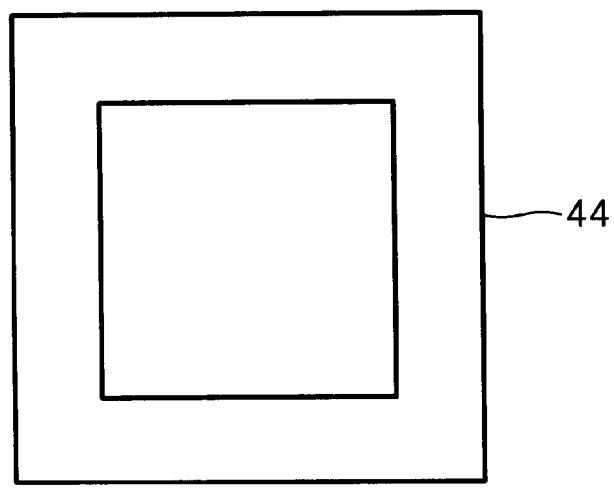
FIG. 5 is a plan view of another modified channel region of the evaporator of FIG. 1.

The coolant contact part A includes the coolant storing part 42 and the cooling part 46 with the channel region 44 in the center. The channel region 44 is extended into upper and lower sides of the cooling part 46 and the second substructure 51. Thus, the channel region 44 has a rectangular shape missing a right-hand side, and the cooling part 46 is surrounded by the channel region 44 and the non-pattern region B. The coolant uniformly and consecutively flows from the coolant storing part 42 to the entire region of the cooling part 46 through the channel region 44. That is, the channel region 44 supplies the coolant to the cooling part 46 not only in one direction but in all directions. In this way, the instant dry-out phenomenon of the entire or a region of the cooling part 46 may be prevented. As long as this purpose is achieved, the channel region 44 may have another shape besides a u-shape shape. For example, as shown in FIG. 4, the channel region 44 may be a straight line shape dividing the coolant contact part A into the coolant storing part and the cooling part by connecting a upper side of the coolant contact part A to a lower side of the coolant contact part A. Further, as shown in FIG. 5, the channel region 44 having a rectangular frame shape surrounding the cooling part 46 may be included in the evaporator. Each region of the coolant storing part 42, the channel region 44, and the cooling part 46 may be modified as necessary. Thus, the width of the channel region 44 between the coolant storing part 42 and a first cooling part 46a corresponding to the heating body H becomes narrower, or the resistance of the coolant in the channel region 44 becomes smaller such that more coolant may be supplied to the first cooling part 46a. In FIG. 1, reference numeral 46b denotes the other region of the cooling part 46 excluding the first cooling part 46a, that is, a second cooling part 46b.

Patterns having various shapes are formed on the bottom corresponding to the coolant storing part 42, the channel region 44, and the cooling part 46 of the coolant contact part A such that the coolant smoothly and uniformly flows from the coolant storing part 42 to the cooling part 46, consecutively.

Meanwhile, the second substructure 51 and a superstructure 50 can be seen in FIG. 3. Reference numeral 43 denotes an element which projects from the bottom surface of the superstructure 50 and defines the channel region 44 in the coolant contact part A. The second substructure 51 is sealed and attached to the circumference of the coolant contact part A of the substrate 40, and lower borders of the superstructure 50 are sealed and attached to the upper borders of the second substructure 51. Preferably, the element 43 for defining the channel region 44 has the same thickness as that of the superstructure 50. In this way, the coolant may be prevented from being flowing into the coolant storing part 42 through another region excluding the coolant inlet A1, and coolant flowing into the coolant storing part 42 flows into the cooling part 46 only through the channel region 44, and the vapor generated in the cooling part 46 is exhausted only through the vapor outlet A2.

Subsequently, referring to FIG. 6, the coolant contact part A includes a first pattern region R1 in which a plurality of first patterns are formed, a second pattern region R2 in which a plurality of second patterns are formed, a third pattern region R3 in which a plurality of third patterns are formed, a fourth pattern region R4 in which a plurality of fourth patterns are formed, and a fifth pattern region R5 in which a plurality of fifth patterns are formed. Preferably, the density of the pattern in a pattern region is uniform, but the densities of patterns in different pattern regions are preferably different. Further, the shapes of patterns formed in different pattern regions are different. For example, since the coolant must uniformly and consecutively flow from the coolant storing part 42 into the cooling part 46, the coolant preferably smoothly, uniformly, and consecutively flows into the cooling part 46 in the pattern formed in the coolant storing part 42 and the channel region 44. On the other hand, the coolant preferably flows into the upper portion of the heating body uniformly and consecutively in all directions in the pattern formed in the cooling parts including the upper portion of the heating body.

Figure 6:
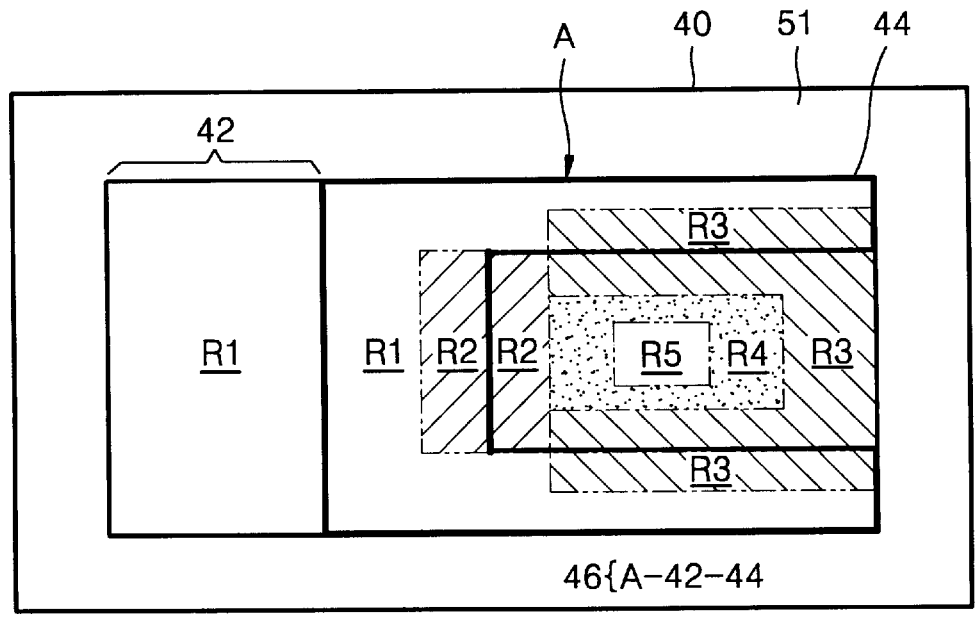
FIG. 6 is a plan view illustrating pattern regions forming the bottom of a coolant contact part of the evaporator of FIG. 1.

Referring to FIGS. 1 and 6, the channel region 44 and the cooling part 46 excluding the coolant storing part 42 are comprised of a plurality of pattern regions.

Figure 14:
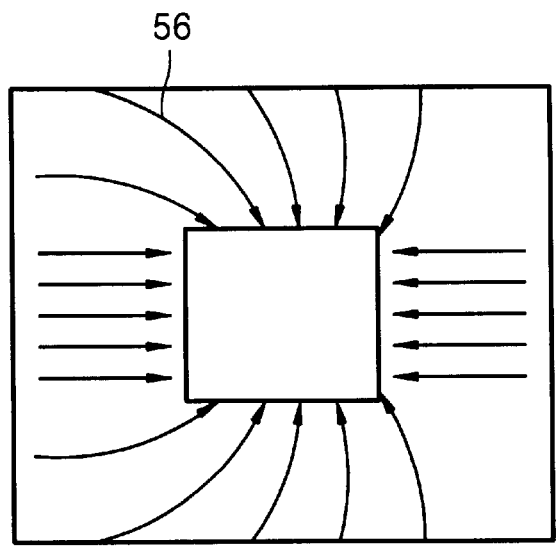
FIG. 14 is a plan view illustrating another embodiment of coolant flow around the fifth pattern region of the pattern regions forming the coolant contact part of FIG. 6.
Figure 15:
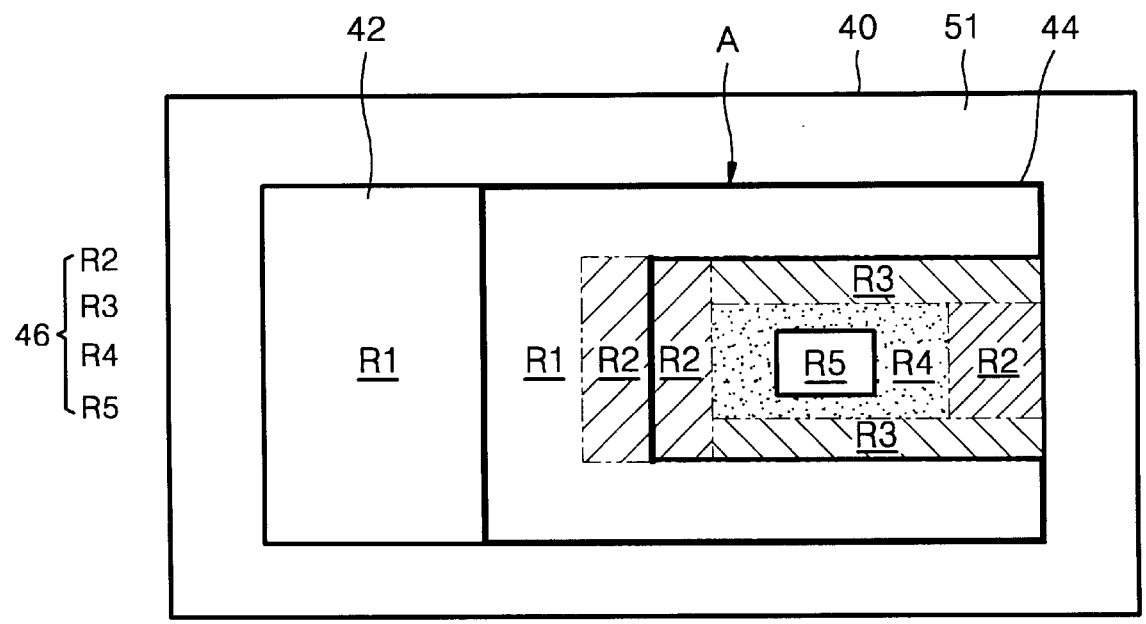
FIGS. 15 through 18 are plan views illustrating arrangements of the pattern regions forming the bottom of a coolant contact part of evaporators of a CPL cooling apparatus according to other embodiments of the present invention.

Specifically, the coolant storing part 42 is only comprised of the first pattern region R1. However, the channel region 44 is comprised of the first through third pattern regions R1, R2, and R3, and the cooling part 46 is comprised of the second through fifth pattern regions R2, R3, R4, and R5. The purpose of the second pattern region R2 of the pattern regions forming the channel region 44 is to maximize pumping of the coolant from the coolant storing part 42 to the center of the cooling part 46. The second pattern region R2 includes part of the channel region 44 contacting the left side of a second cooling part 46b and part of the second cooling part 46a between a vertical portion of the channel region 44 and a first cooling part 46a. The purpose of the third pattern region R3 is to cause the coolant in the channel region 44 having right and left directions as shown in FIGS. 14 and 15 to flow toward the center of the cooling part 46 from above and from below. The third pattern region R3 is extended into part of two horizontal portions of the channel region 44 contacting the first cooling part 46a and into a region of the second cooling part 46b, and is connected along the right side of the coolant contact part A.

That is, all regions excluding left partial regions of the border regions of the second cooling part 46b belong to the third pattern region R3. In FIG. 14, reference numeral 56 denotes the flow of coolant in the third pattern region R3.

The fourth and fifth pattern regions R4 and R5 of the pattern regions forming the cooling part 46 are regions corresponding to an upper portion of he heating body H. The coolant flowing into the cooling part 46 finally reaches these regions where evaporation of the coolant most actively occurs, as shown in FIG. 2. The left side of the fourth and fifth pattern regions R4 and R5 is bounded by the second pattern region R2, and the other portions of the fourth and fifth pattern regions R4 and R5 are bounded by the third pattern region R3. The upper, lower, and right sides of the fourth pattern region R4 border on the third pattern region R3, and the left side of the fourth pattern region R4 borders on the second pattern region R2. That is, the fourth pattern region R4 is surrounded by the second and third pattern regions R2 and R3. The second and third pattern regions R2 and R3 surrounding the fourth pattern region R4 of the cooling part 46 are formed by extending the portions of the second and third pattern regions R2 and R3 formed in the channel region 44.

Assuming that the coolant is smoothly, consecutively, and uniformly supplied from the coolant storing part 42 to the cooling part 46, the structure of the pattern region of the coolant storing part 42, the channel region 44, and the cooling part 46 may be different from FIG. 6, and may be different according to the ace area of the heating body or the amount of heat generated by the heating body.

For example, as shown in FIG. 15, the third pattern region R3 of the pattern regions forming the channel region 44 may be replaced with the first pattern region R1 like the coolant storing part 42, and the third pattern region R3 forming the right side of the cooling part 46 may be replaced with the second pattern region R2 comprised of patterns having a shape for increasing pumping of the coolant into the center of the cooling part 46.

Figure 16:
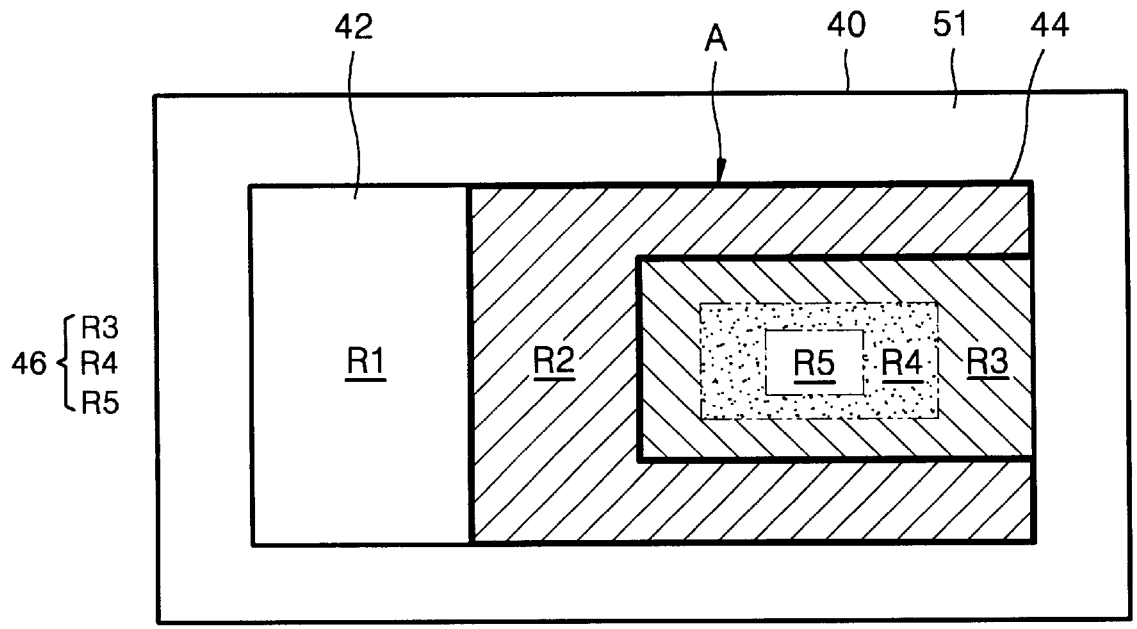

Further, as shown in FIG. 16, the channel region 44 may be only formed of the second pattern region R2 comprised of patterns having a shape for maximizing pumping of the coolant, or may be only formed of the third pattern region R3 comprised of patterns having a shape in which the coolant smoothly flows into the center of the cooling part 47 from all directions.

Likewise, the structure of the pattern region of the coolant storing part 42, the channel region 44, and the cooling part 46 may be different.

Figure 17:
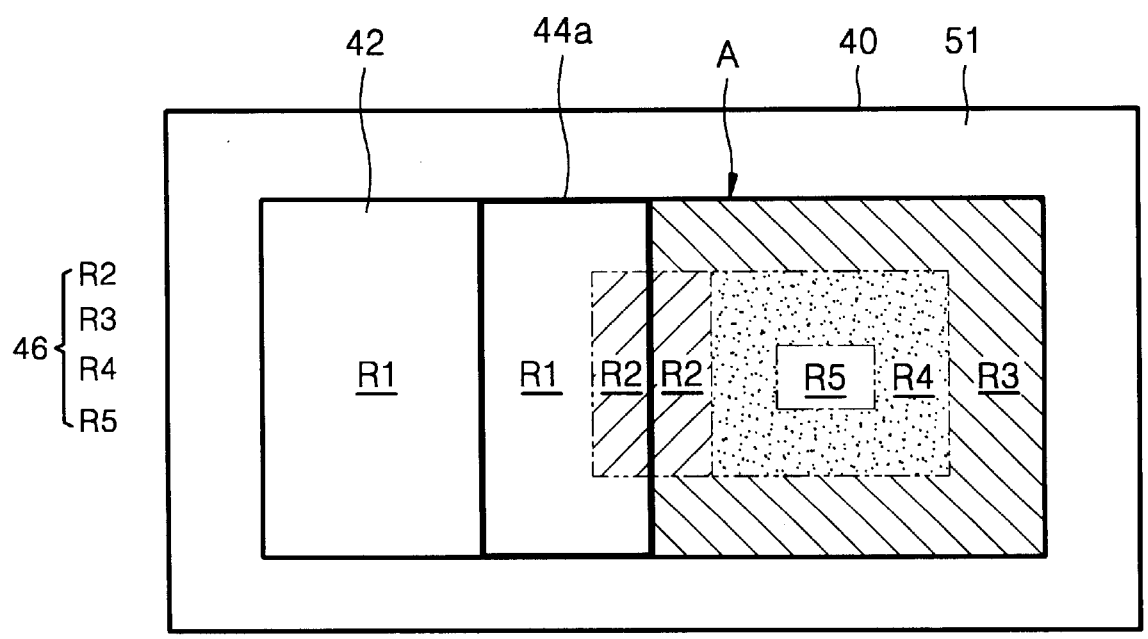
Figure 18:
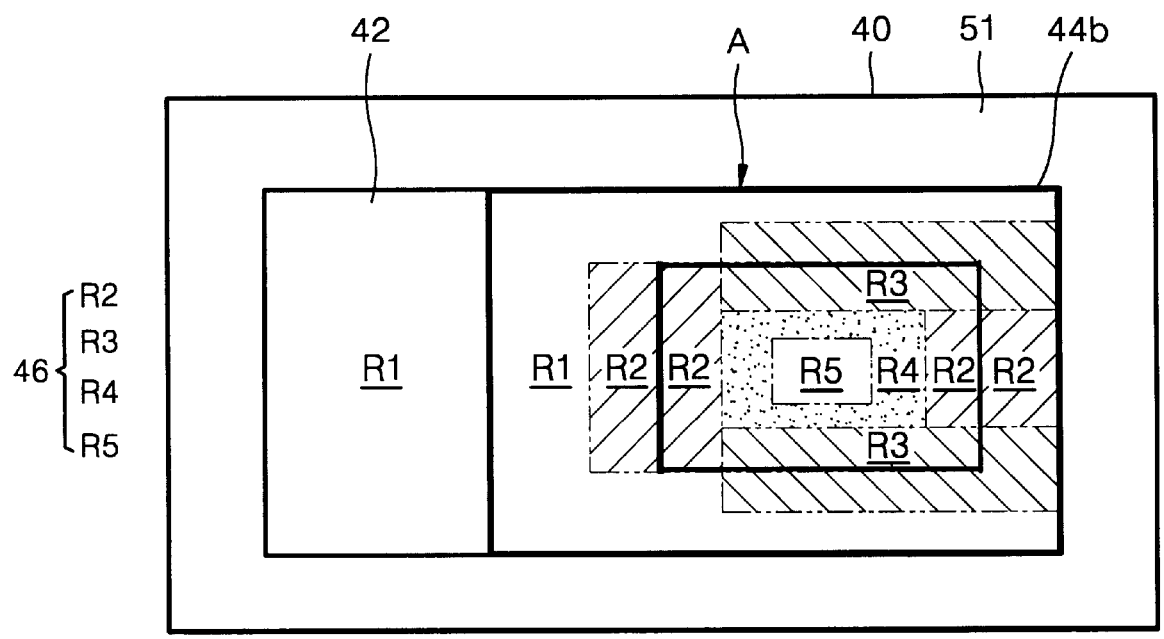

Meanwhile, as shown in FIGS. 17 and 18, in a case where the shape of the channel region 44 is different, the pattern regions forming the coolant storing part 42, the channel region 44, and the cooling part 46 are also different.

Specifically, referring to FIG. 17, a channel region 44a has a straight line shape shown in FIG. 4, for connecting upper and lower sides of the coolant contact part A in a vertical direction and bisecting the coolant contact part A. The channel region 44a is comprised of first and second pattern regions R1, and R2. The first pattern region R1 has a rectangular shape missing a portion of its right-hand side, and the left, upper and lower sides of the second pattern region R2 are surrounded by the first pattern region R1. A fifth pattern region R5 is included in the center of the cooling part 46, and a fourth pattern region R4 is included around the cooling part 46, and the second pattern region R2 of the channel region 44a is extended into the left side to contact the left side of the fourth pattern region R4. The third pattern region R3 is included between the second and fourth pattern regions R2 and R4 and the non-pattern region B. That is, the third pattern region R3 has a u-shape, and right, upper and lower sides of the second and fourth pattern regions R2 and R4 forming the cooling part 46 together with the third pattern region R3 are surrounded by the third pattern region R3.

Referring to FIG. 18, a channel region 44b has a rectangular shape and is comprised of first through third pattern regions R1, R2, and R3. The cooling part 46 surrounded by the channel region 44b is comprised of second through fifth pattern regions R2, R3, R4, and R5. The fifth pattern region R5 is included in the center of the cooling part 46. The fourth pattern region R4 is included around the fifth pattern region R5. The second pattern region R2 is included between the right side of the fourth pattern region R4 and the channel region 44b, and the second pattern region R2 is extended into the non-pattern region B through the right side of the channel region 44b. The second pattern region R2 is included between the right side of the fourth pattern region R4 and the left side of the channel region 44b and is extended into upper and lower sides of the channel region 44b in a vertical direction and is extended into a left partial region of the channel region 44b.

Meanwhile, the third pattern region R3 is included between the second and fourth pattern regions R2 and R4 and the channel region 44b and is extended into upper and lower parts of the channel region 44b, and is extended up to the non-pattern region B in the right direction.

In conclusion, the fourth pattern region R4 is surrounded by the second pattern region R2 on the right and the left and by the third pattern region R3 above and below.

Figure 7:
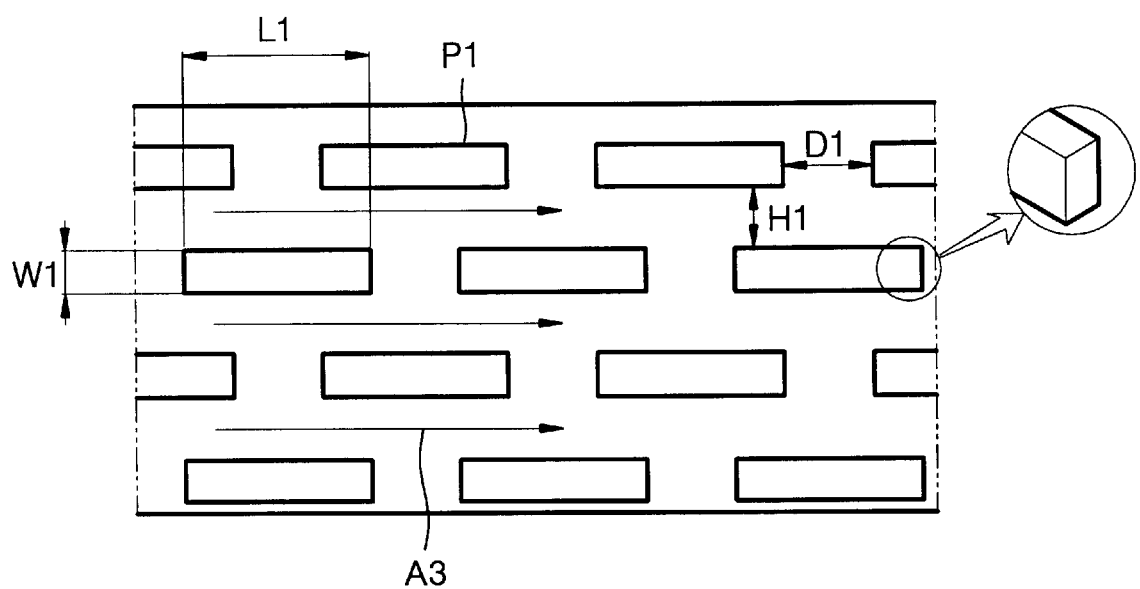
FIGS. 7 through 11 are plan views illustrating patterns of first through fifth pattern regions forming the coolant contact part of FIG. 6, respectively.

Subsequently, referring to FIG. 7, which is a plan view illustrating the structure of patterns formed in the first pattern region R1 of pattern regions forming the coolant contact part A, a plurality patterns P1 formed in the first pattern region R1 have identical shapes. Each of the patterns P1 has a straight line shape with a predetermined length L1 in a direction A3 in which the coolant flows and a predetermined width W1 much shorter than the predetermined length L1. The patterns P1 are arranged in rows in the direction A3 and are spread apart by distance D1 in the direction A3 and by the distance H1 between rows. The patterns P1 forming two adjacent rows are staggered such that the patterns P1 of one row are positioned beside the spaces between patterns of the other row.

Although not shown, the patterns formed in the first pattern region R1 have a predetermined height. Preferably, the height of the patterns P1 formed in the first pattern region R1 is identical. However, the height of the patterns formed in another region excluding the channel region 44 may be higher or lower than patterns formed in the channel region 44.

Likewise, the patterns P1 formed in the first pattern region R1 have solid shapes. In FIG. 7, a magnified perspective view of a pattern P1 shows that the patterns P1 have solid shapes to provide direction to the coolant flowing through the channel region 44.

Figure 8:
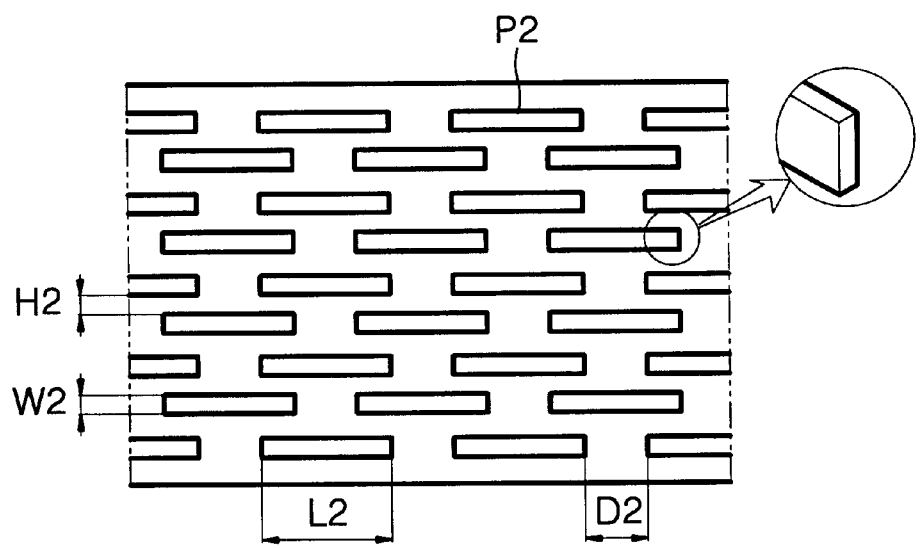

FIG. 8 illustrates the arrangement of patterns P2 forming the second pattern region R2. In FIG. 8, a magnified perspective view of a pattern P2 shows that the patterns P2 have solid shape similar to the patterns P1 forming the first pattern region R1. However, a length L2 and an intra-row distance D2 of the patterns P2 formed in the second pattern region R2 are shorter than the length L1 and the intra-row distance D1 of the patterns P1 formed in the first pattern region R1, and a width W2 and an inter-row distance H2 of the patterns P2 are narrower than the width W1 and the inter-row distance H1 of the pattern P1. As a result, the density of patterns in the second pattern region R2 is higher than the density of patterns in the first pattern region R1. Thus, the coolant flowing into the channel region 44 along the first pattern region R1 uniformly flows into the second pattern region R2 through an increase in the capillary action.

Since the patterns P2 formed on the second pattern region R2 have the same shape as the patterns formed in the first pattern region R1, the coolant flowing into the channel region 44 comprised of the first and second pattern regions R1 and R2 has direction and flows into the cooling part 46.

The channel region 44 having a u-shape is extended into upper and lower regions of the cooling part 46. Among the extended regions, a region near the non-pattern region B is the first pattern region R1, and a region near the cooling part 46 is the third pattern region R3. A plurality of patterns providing direction to the flow of the coolant are formed on the third pattern region R3 such that the coolant flowing in from the adjacent pattern region, that is, the first pattern region R1, flows along the circumference or borders of the cooling parts toward the center of the cooling parts. Preferably, the height of each of the plurality of patterns is the same as the patterns formed in another adjacent pattern regions, but may be higher or lower than the patterns formed in adjacent pattern regions.

Figure 9:
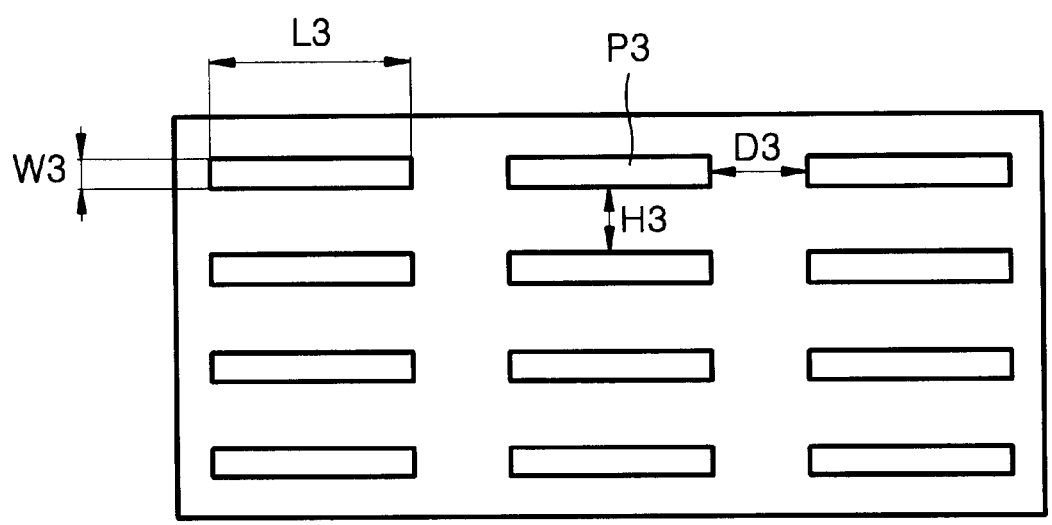

Referring to FIG. 9, a plurality of patterns P3 are formed on the third pattern region R3. The patterns P3 having the same shape as the patterns P2, however, specifications of a length L3, a width W3, an intra-row distance D3, and an inter-row distance H3 of each of the patterns P3 are similar to or a little smaller than the patterns P2 forming the second pattern region R2, and the patterns P3 having matrices shapes are aligned, the patterns P3 have the same shapes as the patterns P2. Thus, the coolant flowing into the channel region 44 quickly flows along the first pattern region R1 and more uniformly flows in the second and third pattern regions R2 and R3 into the cooling part 46 from all directions. The coolant flowing into the third pattern region R3 has vertical and horizontal directions, as can be seen from the alignment of the patterns P3 shown in FIG. 7. Thus, the coolant flowing into the third pattern region R3 of the channel region 44 formed on and under the cooling part 46 uniformly flows into the cooling part 46 like the coolant flowing into the second pattern region R2 of the channel region 44, and flows along the circumference or borders of the cooling part 46 through the third pattern region R3 included at a right side of the cooling part. In this way, the coolant is consecutively and smoothly supplied all over the cooling part 46.

Meanwhile, referring to FIG. 2, the heating body H contacts the bottom surface of the substrate 40 corresponding to the fourth and fifth pattern regions R4 and R5 of the cooling parts 46 and 47 of the substrate 40.

Thus, much heat is transferred from the heating body H into the fifth pattern region R5 and the fourth pattern region R4 which surrounds the fifth pattern region R5 and is surrounded by the second through third pattern regions R2 and R3. Thus, a plurality of patterns formed in the fourth pattern region R4 have shapes in is which the in-flowing coolant is quickly and uniformly supplied around the fifth pattern region R5 and the area contacting the coolant is large, and heat transferred from the heating body H into the fourth pattern region R4 is absorbed and transferred. Further, heat is more intensively transferred from the heating body H into the fifth pattern region R5 than the fourth pattern region R4, and thus, the patterns formed in the fifth pattern region R5 should be a plurality of patterns having a high density and an increased contact area capable of more effectively using the coolant uniformly supplied from the fourth pattern region R4.

Figure 10:
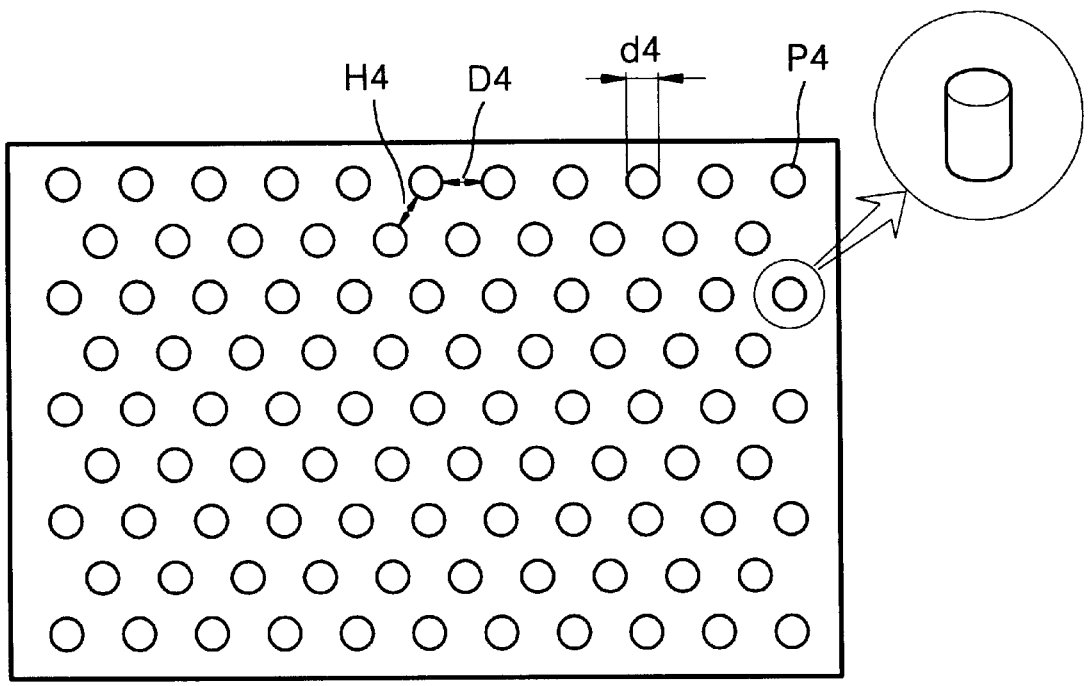
Figure 11:
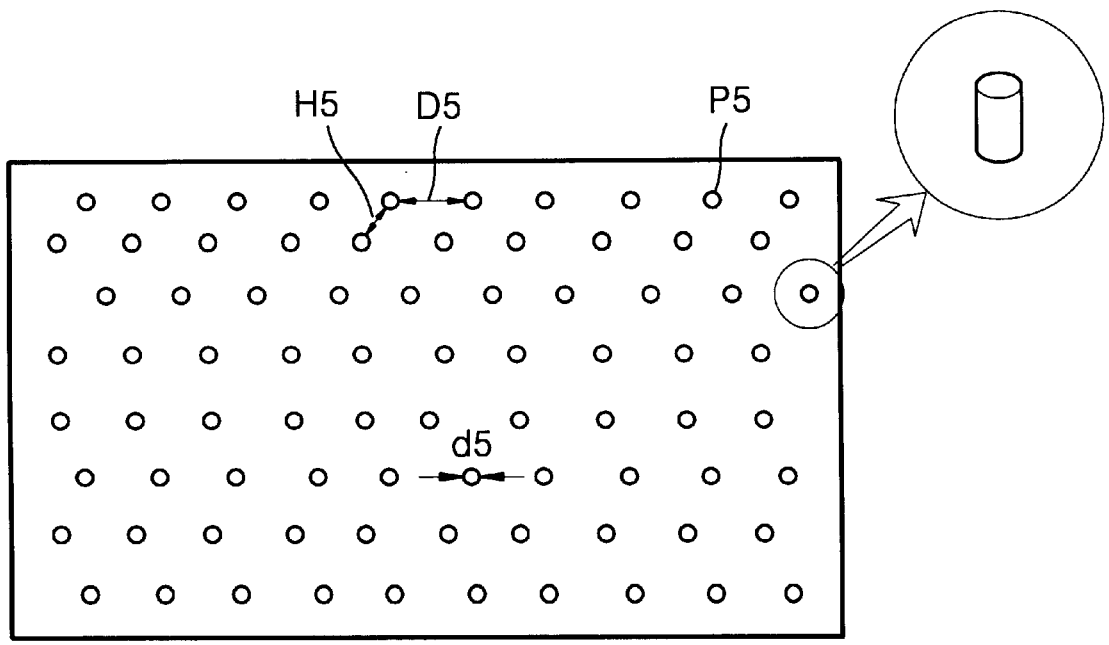

For example, as shown in FIGS. 10 and 11, the patterns P4 and P5 included in the fourth and fifth pattern regions R4 and R5 have solid shapes including predetermined intra-row distances D4 and D5, inter-row distances H4 and H5, heights, and predetermined diameters d4 and d5. Preferably, as shown in the drawings, the patterns P4 and P5 have a circular cylinder shape with predetermined heights. Preferably, the density of the patterns P4 and P5 is uniform over each of the pattern regions. That is, preferably, the patterns P4 and P5 formed in the fourth and fifth pattern regions R4 and R5 are not arranged to provide direction to the flow of the coolant like the patterns P1 and P2 formed in the first pattern region R1 or the second pattern region R2 but are arranged to make the coolant flow isotropically in all directions.

Figure 12:
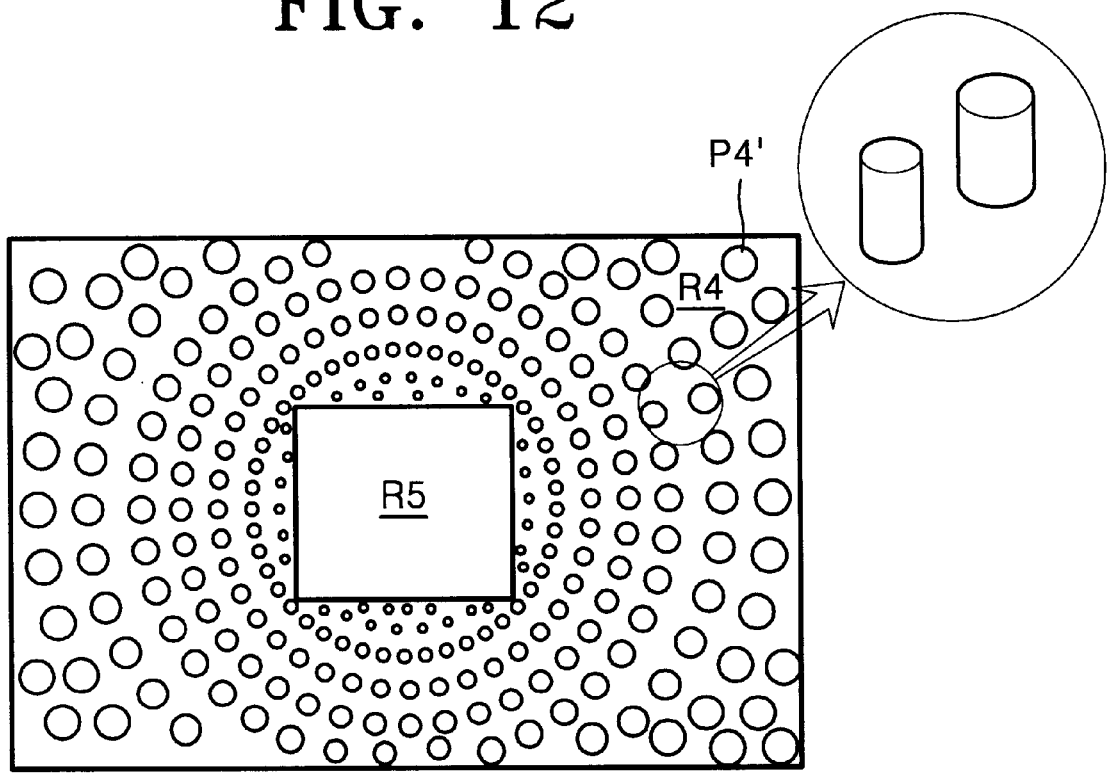
FIG. 12 is a plan view illustrating another pattern of a fourth pattern region of the pattern regions forming the coolant contact part of FIG. 6.

Meanwhile, FIG. 12 illustrates a plurality of patterns having variation in density, formed in the fourth pattern region R4 surrounding the fifth pattern region R5. Most heat is transferred from the heating body H into the fifth pattern region R5 than into any other pattern region forming the cooling part 46. Thus, preferably, the coolant flows into the fifth pattern region R5 simultaneously from all directions. The in-flowing of the coolant is naturally performed, because the fourth pattern region R4 is included around the fifth pattern region R5.

Meanwhile, the coolant flowing into the fifth pattern region R5 from all directions is simultaneously distributed throughout the entire fifth pattern region R5. In this way, heat is uniformly absorbed one the entire fifth pattern region R5, and a partial dry-out phenomenon is prevented, thereby improving cooling efficiency of the heating body H.

In consideration of this, shapes of the patterns P5 formed in the fifth pattern region R5, the number of patterns formed per unit area, that is, the density of patterns, or integration of patterns and distribution of patterns, are considered in an extended line of patterns P4' formed in the fourth pattern region R4. However, in order to remove more quickly and uniformly the heat transferred from the heating body H from the entire of the patterns, the in-flowing coolant may be quickly and uniformly distributed into the entire of the patterns, and the surface area of the fourth and fifth pattern regions R4 and R5 contacting the coolant is as wide as possible.

Thus, the patterns forming the fourth and fifth pattern regions R4 and R5, as shown in FIGS. 10 and 11, have isotropically-distributed geometrical shapes, for example, circular cylinder shapes, such that the in-flowing coolant uniformly and quickly flows in all directions. Also, preferably, the diameter d5 of the patterns P5 included in the fifth pattern region R5 is narrower than the diameter d4 of the patterns P4 formed in the fourth pattern region R4, and the density or integration of the patterns P5 is higher than the density or integration of the patterns P4 formed in the fourth pattern region R4.

Figure 13:
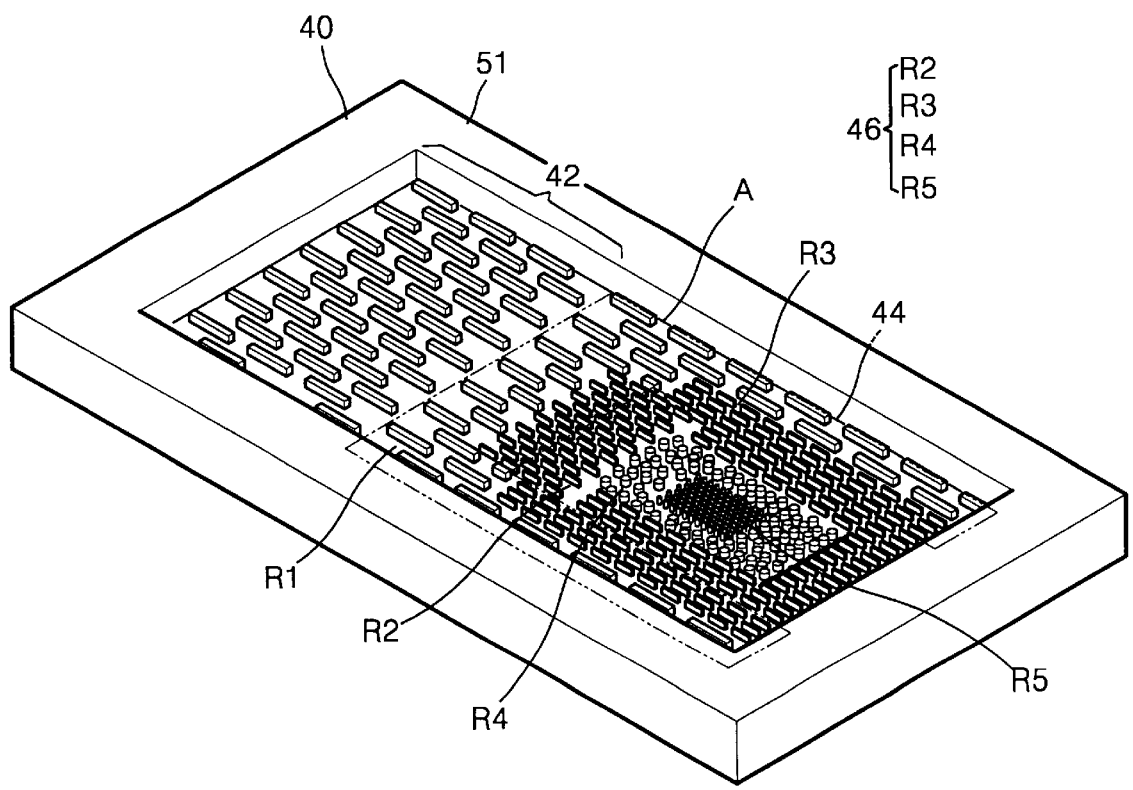
FIG. 13 is a plan view illustrating an arrangement of the first through fifth pattern regions forming the coolant contact part of FIG. 6, a channel region, and patterns formed on each of the pattern regions.

FIG. 13 is a perspective view illustrating a plurality of patterns formed in a plurality of pattern regions forming the coolant contact part A, that is, the first through fifth pattern regions R1, R2, R3, R4, and R5, and the channel region 44. In FIG. 13, the solid shapes of patterns formed in each of the pattern regions, the distribution of patterns, and the density or integration of patterns may be compared with one another. The shapes, distribution, and density of the patterns formed in each of the pattern regions shown in FIG. 13 may be different as long as the coolant may be quickly, uniformly, and consecutively supplied from the coolant storing part 42 to the entire area of the cooling part 46, particularly, to the entire area of the fifth pattern region R5. In particular, the coolant storing part 42 or the channel region 44 is relatively further spaced apart from the heating body H than the cooling part 46. Thus, the structure of pattern regions of the coolant storing part 42 or the channel region 44 and the margin in variation of the patterns formed in each of the pattern regions may be larger than the cooling part 46. As a result, the structure of patterns of the coolant storing part 42 and the channel region 44, or shapes of patterns formed in each of pattern regions, density or integration, and distribution of patterns may be diversely modified compared with the cooling part 46.

Meanwhile, the coolant flowing into the coolant storing part 42 is drawn into the cooling part 46 by the capillary action of the channel region 44. Thus, the amount of the coolant flowing into the cooling part 46 through the channel region 44 is smaller than the amount of the coolant flowing into the coolant storing part 42, and surplus coolant 54 is stored in the coolant storing part 42, as shown in FIG. 2. The amount of coolant that can be stored in the coolant storing part 42 may be controlled by adjusting horizontal and vertical width or height. Preferably, the capacity of the coolant storing part 42 is determined such that the coolant is stably and uniformly supplied to the cooling part 46 even though the coolant is not supplied from the condenser. An upper space 42a in the coolant storing part 42 may be used as a region in which in-flowing uncondensed gases G are collected while the coolant flows into the condenser. Further, the coolant may be stably supplied to the cooling part 46 by storing a predetermined coolant in the coolant storing part 42, thereby improving cooling efficiency of the heating body H. In other words, in a case where the amount of heat generated by the heating body H instantly increases in the cooling part 46, the coolant is instantly evaporated in a predetermined region of the cooling part 46, in particular, in the fourth and fifth pattern regions R4 and R5, and thus, a dry-out phenomenon may occur. In a case where the coolant is maintained at a predetermined level in the coolant storing part 42, the coolant may be constantly supplied to the instantly overheated cooling part 46, thereby preventing a dry-out phenomenon from spreading into the channel region 44 and further into the evaporator.

Referring to FIGS. 2 and 3, the superstructure 50 contacts the non-pattern region B of the circumference of the cooling contact part A and covers the entire coolant contact part A. However, a space for storing the coolant, in which the coolant having a varied phase is contained, is included in the coolant storing part 42 and the cooling part 46. However, the superstructure 50 contacts the channel region 44. Thus, patterns formed in the channel region 44 and the superstructure 50 are in contact. In this way, a fine waterway in which the coolant flows is formed in the channel region 44, and a capillary phenomenon occurs. In other words, the capillary action is generated, and the coolant stored in the coolant storing part 42 by the capillary action caused by the surface tension of the coolant is naturally pumped into the cooling part 46 without the help of any external force. The coolant inlet A1 for allowing the coolant to flow in and the vapor outlet A2 for exhausting the vapor resulting from evaporation of the coolant are included in the upper portion of the coolant storing part 42 and the upper portion of the cooling part 46, respectively. For convenience, patterns formed on the bottom of the coolant contact part A are not shown.

Figure 19:
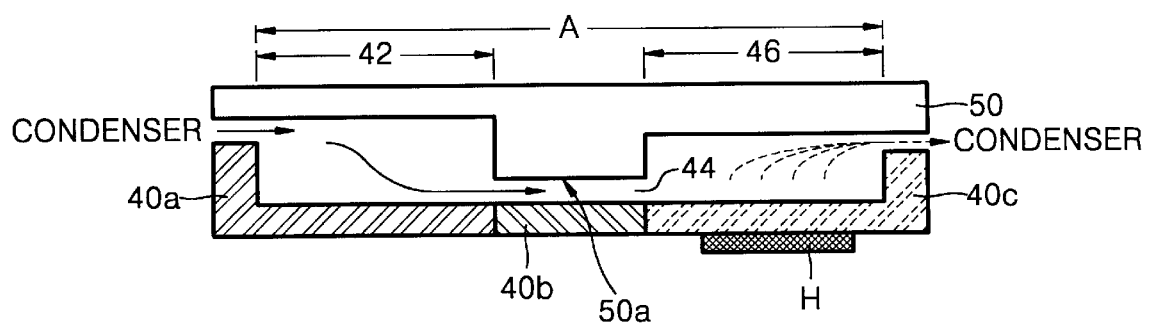
FIGS. 19 through 22 are sectional views illustrating the structure of an evaporator of a capillary pumped loop (CPL) cooling apparatus having a fine wick structure according to another embodiment of the present invention.

FIGS. 19 through 22 are sectional views illustrating the structure of an evaporator of a capillary pumped loop (CPL) cooling apparatus having a fine wick structure according to another embodiment of the present invention. Referring to FIG. 19, third substructures 40a, 40b, and 40c, which are first through third segments, and correspond to the superstructure 50, adhere closely to one another so that coolant is not leaked. The first segment 40a defines the cooling storing part 42 together with the superstructure 50 and is equal to a resultant in which a portion corresponding to the coolant storing part 42 of the substrate (40 of FIG. 2) of the evaporator shown in FIGS. 1 through 18 according to the embodiment of the present invention is combined with a portion surrounding the coolant storing part 42 in the second substructure 51 as a unity. The second segment 40b between the first segment 40a and the third segment 40c is part of the substrate 40 which is opposite to a side 50a defining the channel region 44 of the superstructure 50 and forms a channel which is opposite to the side 50a and in which the coolant flows from the coolant storing part 42 to the cooling part 46 by the capillary action. The second segment 40c is extended perpendicular to a horizontal portion, which adheres closely to the second segment 40b and its bottom surface contacts the heating body H, and consists of a vertical portion spaced apart from the superstructure 50 by a predetermined interval for the exhaust of vapor generated in the cooling part 46. The third segment 40c is equal to a resultant in which a portion corresponding to the cooling part 46 of the substrate 40 of the evaporator shown in FIGS. 1 through 18 according to the embodiment of the present invention is combined with a portion surrounding the cooling part 46 in the second substructure 51 as a unity. Thus, portions extended in a vertical direction toward the superstructure 50 of the first and third segments 40a and 40c are equal to the second substructure (51 of FIGS. 2 and 3).

Various patterns for the flow of the coolant, as shown in FIGS. 7 through 14, are formed on the bottom of each portion corresponding to the coolant storing part 42, the channel region 44, and the cooling part 46 of the first through third segments 40a, 40b, and 40c. However, these patterns have been already described in detail with reference to the above mentioned embodiment and the related drawings, and thus, a detailed description thereof will be omitted. This fact is also applied to FIGS. 20 through 22.

Figure 20:
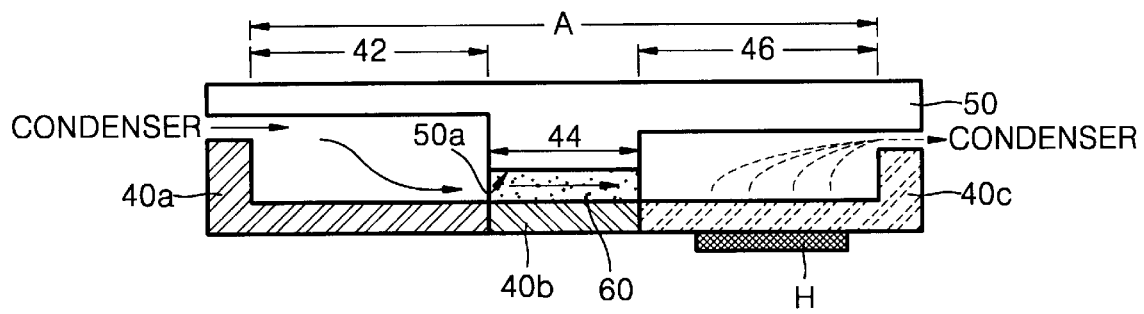

FIG. 20 illustrates a case where a first pumping means 60 for pumping the coolant is included in the channel region 44 in the embodiment shown in FIG. 19. In such a case, an additional pattern is not included on the second segment 40b.

Specifically, referring to FIG. 20, the first pumping means 60 for pumping the coolant from the coolant storing part 42 to the cooling part 46 using the capillary action is included between the second segment 40b and the side 50a defining the channel region 44 of the superstructure 50. A side (hereinafter, a first side) facing the coolant storing part 42 of the first pumping means 60 contacts the coolant flowing into the coolant storing part 42, and a side (hereinafter, a second side) facing the cooling part 46 is near or contacts the patterns formed in the cooling part 46. In this way, the coolant pumped by the first pumping means 60 passes through the first pumping means 60, reaches the second side and simultaneously flows direct into the cooling part 46. The first pumping means 60 is formed of a material by which the capillary action is generated in the coolant flowing into the coolant storing part 42 and the coolant flowing into the first pumping means 60 is pumped to the second side by the capillary action, but the first pumping means 60 is preferably formed of a porous material. Preferably, in such a case, a hole in the porous material has a size capable of applying the capillary action in which the coolant flowing into the coolant storing part 42 is sufficiently pumped to the second side.

Meanwhile, the first side facing the coolant storing part 42 of the first pumping means 60 may be further extended into the coolant storing part 42. That is, the first side of the first pumping means 60 may project to the coolant storing 42 to a predetermined length.

Figure 21:
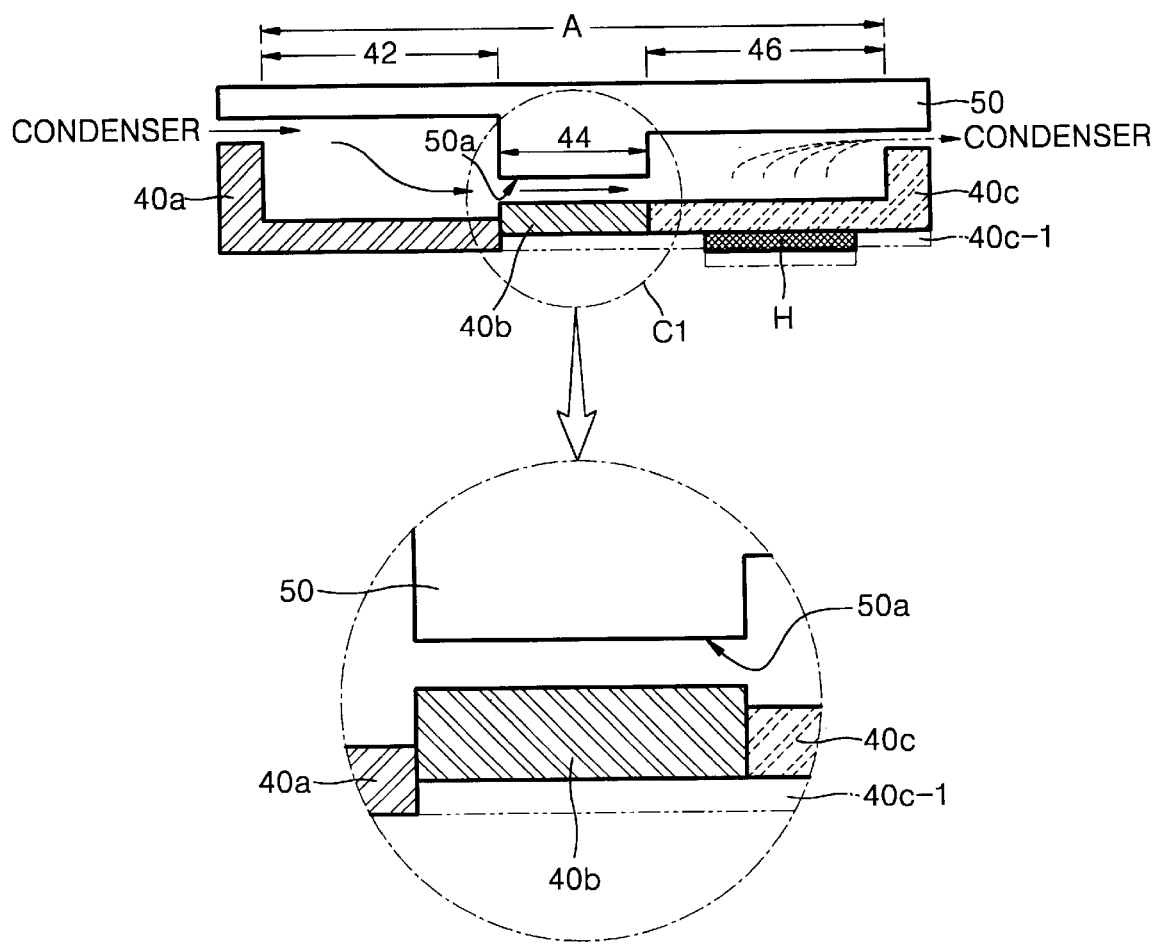

FIG. 21 illustrates another modification of the embodiment shown in FIG. 19. Referring to FIG. 21, the second segment 40b and the third segment 40c are included as shown in FIG. 19. However, the first segment 40a and the second segment 40b have step at their boundary. That is, the surface of a horizontal portion in which the first segment 40a contacts the second segment 40b is lower than the surface of the second segment 40b. This result is equal to that the first segment 40a moves downward as much as a predetermined distance along the side of the second segment 40b which adheres closely to the first segment 40a. In such a case, a movement distance is preferably smaller than the thickness of the second segment 40b. In this way, part of the side in which the second segment 40b contacts the first segment 40a contacts the coolant flowing into the coolant storing part 42. The exposed side of the second segment 40b becomes a projection for the coolant moving from the coolant storing part 42 to the cooling part 46.

Thicknesses of horizontal portions of the first through third segments 40a, 40b, and 40c are the same. Thus, in a case where step occurs between upper sides of the first and second segments 40a and 40b, step occurs even between lower sides of the first and second segments 40a and 40b. Due to the step, a space 40c-1 having a thickness corresponding to the step exists under the second and third segments 40b and 40c. The space 40c-1 may be as it is or may be filled with another material. In the latter case, the heating body H should be attached to the lower side of the space 40c-1, and thus, the space 40c-1 is preferably formed of the same material as that of the third segment 40c or a material with thermal conductivity higher than the third segment 40c.

Meanwhile, a drawing illustrating a portion defined by a first circle C1 in FIG. 21 is shown below FIG. 21. Referring to the drawing, the thickness of the second segment 40b may be larger than those of the first and third segments 40a and 40c, and the surface of the second segment 40b may become higher than that of the horizontal portions of the first and third segments 40a and 40c. Thus, a channel between the second segment 40b and the side 50a defining the channel region 44 of the superstructure 50 becomes higher than the surfaces of the horizontal portions of the first and third segments 40a and 40c, allowing the three-dimensional supply of the coolant.

Figure 22:
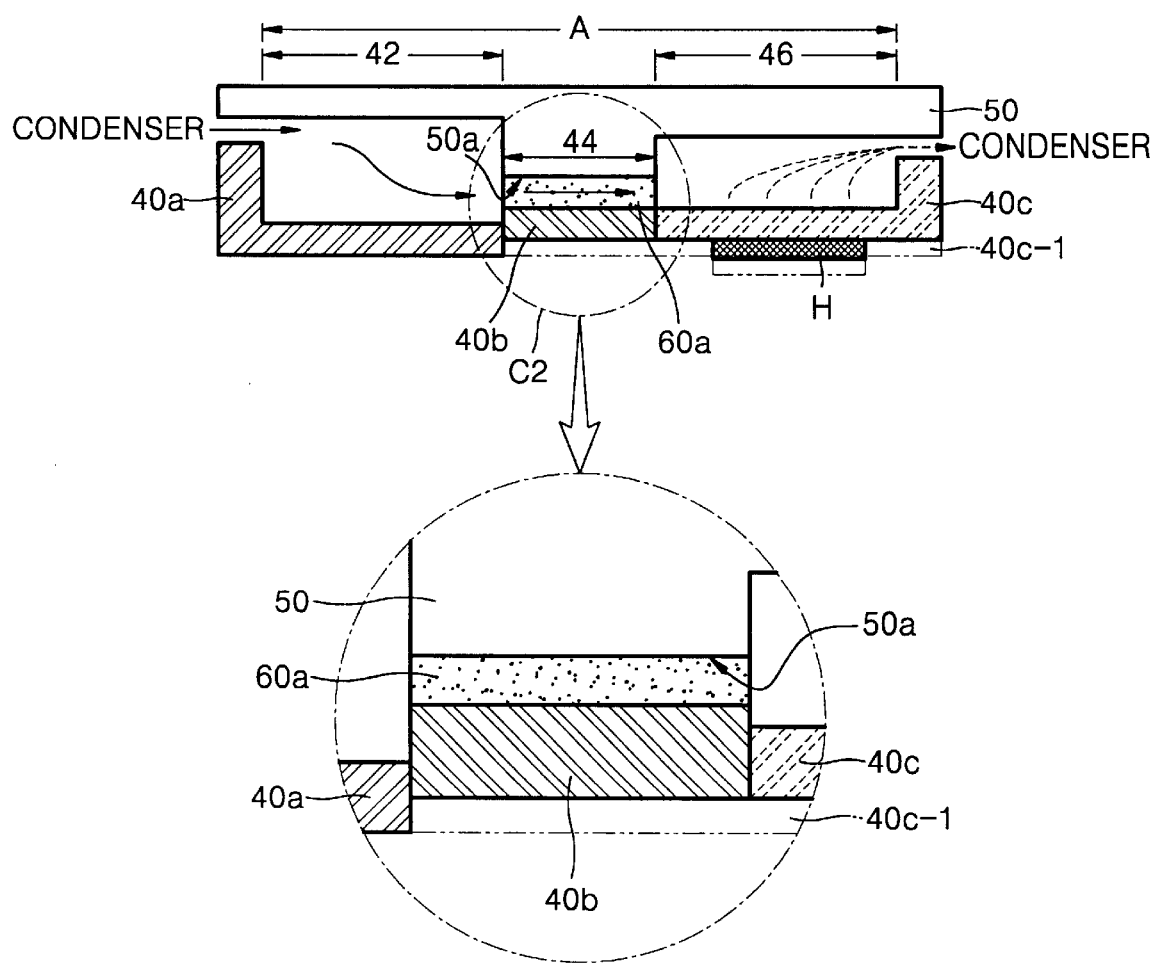

FIG. 22 illustrates a case where a second pumping means 60a for pumping the coolant instead of patterns is included in the channel region 44 in the embodiment shown in FIG. 21.

Specifically, the second pumping means 60a is included between the second segment 40b and the side 50a defining the channel region 44 of the superstructure 50, that is, between the second segment 40b and a side opposite to the second segment 40b. Preferably, the second pumping means 60a may be the same as the first pumping means (60 of FIG. 20) but may be different.

For example, the second pumping means 60a may be formed of combination of a porous material with patterns. That is, a portion near the coolant storing part 42 of the second pumping means 60a is formed of a first porous material, and a portion near the cooling part 46 is formed of a second porous material, and a middle portion of the coolant storing part 42 and the cooling part 46 is formed of patterns that are formed so that the capillary action is generated in the coolant connecting the first and second porous materials to each other and flowing into the first porous material. Alternatively, a portion near the coolant storing part 42 of the second pumping means 60a may be formed of patterns that are formed so that the capillary action is generated in the coolant flowing into the coolant storing part 42, and the other portions may be formed of a porous material. Alternatively, a portion near the coolant storing part 42 of the second pumping means 60a, and a middle portion of the coolant storing part 42 and the cooling part 46 may be formed of porous materials, and a portion near the cooling part 46 may be formed of patterns that are formed so that the capillary action is generated in the in-flowing coolant through the porous materials forming the middle portion.

Meanwhile, a drawing illustrating a portion defined by a second circle C2 in FIG. 22 is shown below FIG. 22. Referring to the drawing, the second pumping means 60a is included between the second segment 40b and the side 50a opposite to the second segment 40b, of the superstructure 50 even in a case where the second segment 40b becomes higher than the first and third segments 40a and 40c. In such a case, as described above, the second pumping means 60a may be formed of combination of a porous material and patterns.

Although many things are described in specific terms above, the above disclosure relates to examples of preferred embodiments of the present invention and should not be construed as limiting the scope thereof. For example, those skilled in the art may further include another pattern region in the first pattern region R1 forming the coolant storing part 42. Further, part of the coolant storing part 42 may be further extended into the cooling part 46, and the first pattern region R1 may be part of the pattern regions forming the cooling part 46. Also, the channel region 44 may have a shape other than a u-shape in the present invention.

Further, various combinations of the above mentioned changes in the form of the cooling parts, the channel region, and the coolant storing part may be made. Various changes in form of the density of the patterns of the pattern regions forming the cooling parts, the channel region, and the coolant storing part, and shapes of the patterns formed in each of the pattern regions may also be made. The channel region 44 may have a shape extended by the coolant storing part 42 as well as the cooling part 46. Further, at least one pattern region of the pattern regions forming the bottoms of the coolant storing part 42, the cooling part 46, and the channel region 44 may be a pattern region in which patterns are distributed so that the density of the patterns, that is, integration of the patterns, becomes higher or lower from one position to another position of the pattern regions. Also, patterns higher or lower than patterns formed on the bottom of the channel region 44 may be included on the bottom of the coolant storing part 42 or the cooling part 46. Alternatively, specific patterns may be not included on the bottom of the coolant storing part 42. Thus, the scope of the present invention is not defined by the described embodiments but should be defined by the appended claims.

As described, the present invention includes the coolant storing part for storing in-flowing coolant from the condenser and the uncondensed gas in a non-condenser, thereby stably supplying the coolant, minimizing accumulation of the uncondensed gas in the condenser, supplying an amount of coolant equal to the amount removed by evaporation in the cooling part from the coolant storing part to the cooling part uniformly and consecutively, preventing a dry-out phenomenon, and improving the cooling efficiency of the evaporator.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An evaporator of a capillary pumped loop (CPL) cooling apparatus comprising a condenser, an evaporator for being supplied coolant from the condenser and cooling a heating body according to variation in a phase of the coolant, the evaporator having a flat board shape, of a CPL cooling apparatus comprising:

a coolant storing part for storing in-flowing coolant from the condenser and collecting a uncondensed gas contained in the in-flowing coolant in an upper space;

a cooling part for cooling the heating body through vaporization of the coolant; and superstructure and substructure combined with each other, for defining a channel region in which the coolant flows from the coolant storing part to the cooling part by a capillary action.

2. The evaporator of a CPL cooling apparatus of claim 1, wherein the substructure includes a first substructure used as a substrate, and a second substructure forming a coolant inlet formed along a border of the first substructure and connected to a coolant outlet of the condenser between the substructure and the superstructure, and a vapor outlet connected to a vapor inlet of the condenser.

3. The evaporator of a CPL cooling apparatus of claim 2, wherein the channel region is formed between the coolant storing part and the cooling part, and part of the channel region is extended between the cooling part and the second substructure.

4. The evaporator of a CPL cooling apparatus of claim 3, wherein another part of the channel region is extended into the coolant storing part and the second substructure.

5. The evaporator of a CPL cooling apparatus of claim 2, wherein the channel region has a u-shape, a straight line shape, or a rectangular shape.

6. The evaporator of a CPL cooling apparatus of claim 1, wherein the bottom of the coolant storing part is formed of at least one pattern region.

7. The evaporator of a CPL cooling apparatus of claim 1, wherein the bottom of the cooling part is formed of at least one pattern region.

8. The evaporator of a CPL cooling apparatus of claim 2, wherein the bottom of the channel region is formed of at least one pattern region.

9. The evaporator of a CPL cooling apparatus of claim 6, wherein the bottom of the coolant storing part is formed of a first pattern region.

10. The evaporator of a CPL cooling apparatus of claim 9, wherein at least one other pattern region is further included in the first pattern region.

11. The evaporator of a CPL cooling apparatus of claim 7, wherein the bottom of the cooling part is formed of a first pattern region.

12. The evaporator of a CPL cooling apparatus of claim 11, wherein at least one other pattern region is further included in the first region.

13. The evaporator of a CPL cooling apparatus of claim 7, wherein the cooling part consists of second and third pattern regions, a fourth pattern region surrounded by the second and third pattern regions, and a fifth pattern region surrounded by the fourth pattern region.

14. The evaporator of a CPL cooling apparatus of claim 7, wherein the bottom of the cooling part consists of a fourth pattern region and a fifth pattern region surrounded by the fourth pattern region.

15. The evaporator of a CPL cooling apparatus of claim 14, wherein a third pattern region is included around the fourth pattern region, and the third pattern region contacts the channel region.

16. The evaporator of a CPL cooling apparatus of claim 8, wherein the bottom of the channel region is formed of a first pattern region.

17. The evaporator of a CPL cooling apparatus of claim 16, wherein at least one other pattern region is further included in the first pattern region.

18. The evaporator of a CPL cooling apparatus of claim 16, wherein the bottom of the channel region further includes second and third pattern regions in addition to the first pattern region, and the first pattern region contacts a pattern region comprising the coolant storing part, and each of the second and third pattern regions contacts a pattern region comprising the cooling part.

19. The evaporator of a CPL cooling apparatus of claim 18, wherein the first and third pattern regions are extended into the cooling part of the channel region and the substrate.

20. The evaporator of a CPL cooling apparatus of claim 19, wherein a pattern region comprising the bottom of the cooling part contacting the third pattern region is the third pattern region.

21. The evaporator of a CPL cooling apparatus of claim 18, wherein the second pattern region is extended into the cooling part.

22. The evaporator of a CPL cooling apparatus of claim 9, wherein a plurality of patterns providing direction to the flow of the coolant are formed on the first pattern region such that the coolant flowing from the condenser flows toward the cooling part.

23. The evaporator of a CPL cooling apparatus of claim 22, wherein each of the plurality of patterns formed in the first pattern region has a predetermined height and a predetermined geometrical shape in which the flat shape of each of the plurality of patterns has a predetermined length in a direction of the flow of the coolant.

24. The evaporator of a CPL cooling apparatus of claim 23, wherein the patterns are distributed in lines to direct the flow of the coolant, are spaced apart from one another by a predetermined interval, and are alternately distributed in a longitudinal direction.

25. The evaporator of a CPL cooling apparatus of claim 23, wherein the height of the patterns formed on the coolant storing part among the patterns formed in the first pattern region is higher or lower than the height of patterns formed in the channel region.

26. The evaporator of a CPL cooling apparatus of claim 13, wherein a plurality of patterns providing direction to the flow of coolant are formed in the second pattern region such that coolant flowing from adjacent pattern regions flows toward the cooling part or the center of the cooling part.

27. The evaporator of a CPL cooling apparatus of claim 26, wherein each of the plurality of patterns formed in the second pattern region has a predetermined height and a predetermined geometrical shape in which the flat shape of each of the plurality of patterns has a predetermined length in a direction of the flow of the coolant.

28. The evaporator of a CPL cooling apparatus of claim 26, wherein the patterns are distributed in lines to direct the flow of coolant, are spaced apart from one another by a predetermined interval and are alternately distributed in a longitudinal direction.

29. The evaporator of a CPL cooling apparatus of claim 26, wherein the height of the patterns formed in a region excluding the channel region among the patterns formed in the second pattern region is higher or lower than the height of patterns formed in the channel region.

30. The evaporator of a CPL cooling apparatus of claim 13, wherein a plurality of patterns providing direction to the flow of the coolant are formed in the third pattern region such that the coolant flowing from the adjacent pattern region flows along the circumference or border of the cooling part and then turns toward the center of the cooling part.

31. The evaporator of a CPL cooling apparatus of claim 30, wherein each of the plurality of patterns formed in the third pattern region has a predetermined height, and the patterns are arranged in adjacent rows exactly adjacent to one another.

32. The evaporator of a CPL cooling apparatus of claim 30, wherein the height of the plurality of patterns is higher or lower than the patterns formed in the adjacent pattern region.

33. The evaporator of a CPL cooling apparatus of claim 13, wherein a plurality of patterns are distributed in the fourth pattern region such that the coolant flowing from the adjacent pattern region flows into the center of the cooling part, and simultaneously isotropically flows into the entire fourth pattern region.

34. The evaporator of a CPL cooling apparatus of claim 33, wherein each of the plurality of patterns formed in the fourth pattern region has a predetermined height.

35. The evaporator of a CPL cooling apparatus of claim 33, wherein the height of the plurality of patterns is higher or lower than the patterns formed in the adjacent pattern region.

36. The evaporator of a CPL cooling apparatus of claim 33, wherein the thicknesses of the plurality of patterns become smaller from the fourth pattern region to the fifth pattern region.

37. The evaporator of a CPL cooling apparatus of claim 13, wherein a plurality of patterns are distributed in the fifth pattern region such that the coolant flowing from the adjacent pattern region uniformly and quickly flows into the entire fifth pattern region.

38. The evaporator of a CPL cooling apparatus of claim 37, wherein the thickness of each of the plurality of patterns is the same as the patterns formed in the adjacent pattern region, or smaller than the patterns formed in the adjacent pattern region.

39. The evaporator of a CPL cooling apparatus of claim 38, wherein each of the plurality of patterns is a circular cylinder having a predetermined height.

40. The evaporator of a CPL cooling apparatus of claim 1, wherein the substructure comprises:

a first segment comprising the coolant storing part together with the superstructure an d forming a coolant inlet connected to the coolant outlet of the condenser;

a second segment being opposite to a side defining the channel region of the superstructure and whose one side adheres closely to the first segment so that the coolant is not leaked; and a third segment comprising the cooling part together with the superstructure, forming a vapor outlet connected to the vapor inlet of the condenser and adhering closely to the other side of the second segment so that the coolant is not leaked.

41. The evaporator of a CPL cooling apparatus of claim 40, wherein step exists between the first and second segments and/or between the second and third segments.

42. The evaporator of a CPL cooling apparatus of claim 40, wherein a pumping means for pumping the coolant filling the channel region and flowing into the coolant storing part to the cooling part is included between the second segment and the side defining the channel region of the superstructure.

43. The evaporator of a CPL cooling apparatus of claim 42, wherein the pumping means is formed of a porous material.

44. The evaporator of a CPL cooling apparatus of claim 42, wherein the pumping means is formed of a porous material and patterns formed in part of the second segment, and the patterns are formed so that the capillary action is generated in the coolant flowing into the coolant storing part or the in-flowing coolant through the porous material.

45. The evaporator of a CPL cooling apparatus of claim 43, wherein the porous material is extended into the coolant storing part as much as a predetermined length.

46. The evaporator of a CPL cooling apparatus of claim 42, wherein part of the channel region is extended into the cooling part and a vertical portion of the third segment.

47. The evaporator of a CPL cooling apparatus of claim 46, wherein another part of the channel region is extended into the coolant storing part and a vertical portion of the first segment.

48. The evaporator of a CPL cooling apparatus of claim 42, wherein at least one or more kind of patterns are formed on the bottom of the cooling part, and the patterns are formed so that the capillary action is generated in the coolant flowing into the cooling part.

49. The evaporator of a CPL cooling apparatus of claim 42, wherein patterns having predetermined shapes are formed on the bottom of the coolant storing part.

* * * * *